United States Patent [19]

Mese et al.

[11] 4,109,211
[45] Aug. 22, 1978

[54] VARIABLE THRESHOLDING CIRCUIT FOR CONVERTING AN ANALOG SIGNAL TO A BINARY SIGNAL

[75] Inventors: Michihiro Mese, Hachioji; Masakazu Ejiri, Tokorozawa; Seiji Kashioka, Kokubunji; Takafumi Miyatake, Hachioji; Toshimitsu Hamada, Tokyo, all of Japan

[73] Assignee: Hitachi, Ltd., Japan

[21] Appl. No.: 649,809

[22] Filed: Jan. 16, 1976

[30] Foreign Application Priority Data

Jan. 16, 1975 [JP] Japan .................................. 50-6266
Nov. 14, 1975 [JP] Japan ............................... 50-136379

[51] Int. Cl.² .............................................. H03K 5/18
[52] U.S. Cl. .................................. 328/116; 307/358; 340/146.3 AG
[58] Field of Search ............. 340/146.3 AG; 325/326; 178/88; 328/115, 116; 307/359, 358

[56] References Cited

U.S. PATENT DOCUMENTS

3,869,698  3/1975  Trost et al. ................. 340/146.3 AG
3,909,594  9/1975  Allais et al. ............ 340/146.3 AG X

OTHER PUBLICATIONS

Penny, Dynamic Threshold Setting Circuit, IBM Technical Disclosure Bulletin, vol. 18, No. 6, 11/1975, pp. 1962-1965.

Wilson, Thresholding of Video Signals, IBM Technical Disclosure Bulletin, vol. 16, No. 12, 5/1974, pp. 4021, 4022.

*Primary Examiner*—Thomas J. Sloyan
*Attorney, Agent, or Firm*—Craig & Antonelli

[57] ABSTRACT

A variable thresholding circuit for converting an analog signal to a binary signal comprises a comparator to which signals to be converted are applied and a threshold circuit coupled with the comparator in order to provide the threshold level of the comparator, so that the signals applied to the comparator are converted into binary signals in accordance with the threshold level. The threshold level corresponding to the output of the threshold circuit is compensated in accordance with the variations of the levels of the signals applied to the comparator. The threshold level of the comparator is changed to a compensated level when the result calculated from the threshold level and the signals applied to the comparator is smaller than a predetermined value, whereas the threshold level of the comparator is not changed to the compensated one when the result calculated from the threshold level and the signals applied to the comparator is larger than that and the compensation is repeated until the calculated result becomes smaller than the predetermined value.

12 Claims, 7 Drawing Figures

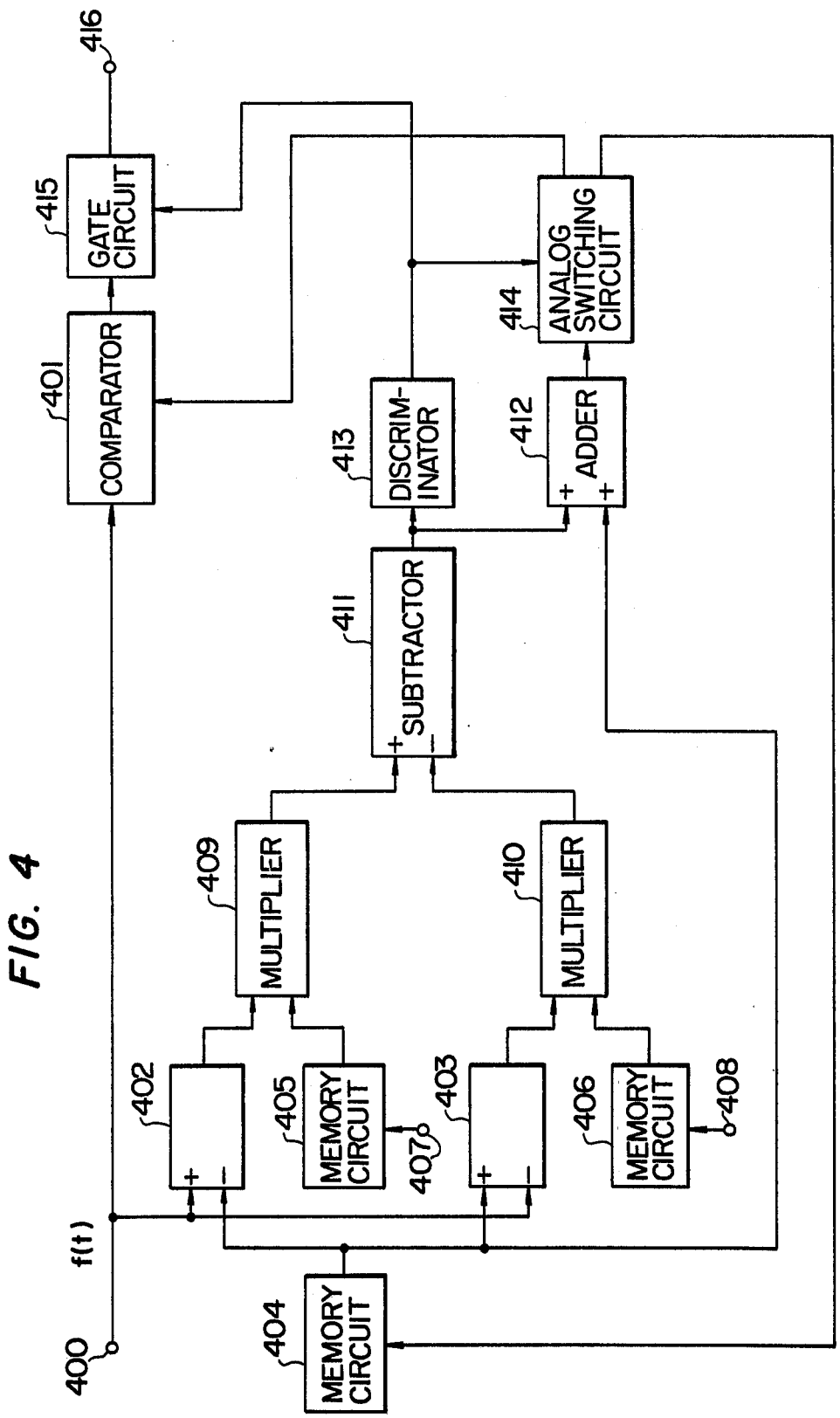

COMPLEMENTARY DISTORTION CIRCUIT

BACKGROUND OF THE INVENTION (a) Field of the Invention

Broadly speaking, this invention relates to signal transmission systems. More particularly, in a preferred embodiment, this invention relates to signal transmission systems in which the distortion produced by non-linearities in the operation of an active device is substantially eliminated through the introduction of a compensating, distortion-cancelling signal.

(b) Discussion of the Prior Art

Pre-distortion and post-distortion techniques for cancelling the distortion introduced by the non-linear transfer characteristics of active devices, such as amplifiers, are well known. In a typical prior art arrangement, for example, as discussed in U.S. Pat. No. 3,383,618 which issued on May 14, 1968 to R. S. Engelbrecht, a non-linear device in a compensation circuit is driven by a portion of the output signal of an amplifier. The non-linear device generates a composite signal containing a host of distortion components covering a range of multiple orders of distortion. All of these distortion components pass through two controllers, one for phase and the other for amplitude, before they are coupled with the output signal of the amplifier to provide a reduction in overall signal distortion through complementary cancellation. In the above and other similar arrangements, it is necessary to adjust the phase and amplitude of all of the distortion components as a single composite signal to eliminate the third-order distortion and thereby obtain an overall reduction in signal distortion.

Whenever the signal bandwidth is small compared to the center frequency, the even orders of non-linear distortion fall outside the signal band and only certain odd orders of distortion fall inside the signal band. Of these odd orders of distortion the third order is likely to be the largest and most troublesome. The higher orders of distortion, that is orders greater than the third, which are present in the output of an uncompensated bandpass amplifier, are usually small. The higher, odd-order distortion components present in the output of the non-linear device which is used to compensate the amplifier have a different phase and amplitude than the corresponding higher orders of distortion in the output of the amplifier. These differences are due to unavoidable minute deviations between the characteristics of the compensating non-linear device and the amplifier. Therefore, when these two outputs are combined, the third-order distortion may be reduced, but the higher orders of distortion are typically magnified. This disadvantageous compromise renders many prior art distortion compensation techniques ineffective for numerous applications. Such compensation techniques are particularly inadequate for use in analogue transmission systems which employ, in tandem, numerous repeater amplifiers in the transmission path.

To overcome the above problem, the distortion compensating circuit disclosed in commonly-assigned U.S. Pat. No. 3,825,843, which issued on July 23, 1974 to R. I. Felsberg and H. Miedema, was developed. In this circuit, third-order distortion in a signal path is substantially eliminated without a detrimental increase in higher orders of distortion. A portion of the signal in the signal path is extracted and applied to a squarer and a multiplier which together comprise a compensation circuit. The squarer operates on its input signal to produce a second-order output signal. In the multiplier, the second-order output signal and the other input signal thereto are multiplied together to produce a third-order output signal. The phase and amplitude of the third-order signal are adjusted to provide a compensating signal. This compensating signal is then coupled to the signal path so that the third-order distortion produced in the signal path is substantially eliminated through complementary cancellation.

Although the circuit disclosed in the above-referenced U.S. Pat. 3,825,843 was successful in eliminating third-order distortion, the interaction between this circuit and the non-linear circuit it is intended to linearize introduces higher orders of distortion not originally present in the output signal. These higher order distortion components are, however, relatively low in amplitude when the output level is well below saturation and do not pose a problem in most applications. However, the level of these higher order components increases rapidly with increasing signal levels and the trend to even higher output levels can reach the point where these higher-order distortion components may no longer safely be ignored.

Accordingly, as taught in the U.S. Pat. No. 4,016,497, if the distortion compensating circuit shown in U.S. Pat. No. 3,825,843 is modified such that it operates in a feedbackward mode rather than a feedforward mode, the third-order distortion terms are eliminated, as before, but without the generation of additional higher order distortion terms.

Unfortunately, even the improved distortion cancelling circuit disclosed in the referenced co-pending application of Miedema has its drawbacks. More specifically, the circuit is relatively expensive to manufacture, due to the cost of the cuber, phase resolver, amplifier, etc., and the initial adjustment of the device is fairly complex, due to the need to adjust the delay of the separate circuit branches.

An article entitled "Réseau linéariseur pour tube á onde progressive" (Linearizing System for Travelling-Wave Tubes) by C. Bremenson and P. Jaubert, Revue Technique Thomson CSF, Vol. 6, No. 2, June 1974, pp. 529-548, discloses a complementary distortion circuit which employs a varistor arrangement as the non-linear element in a bridge circuit. As shown in FIG. 9 of the Bremenson and Jaubert article, the complementary distortion circuit, designed to operate at 6 GHz, includes a 3 db — 90° hybrid coupler, a 3 db — 180° hybrid coupler and a non-linear varistor circuit in the lower branch. This arrangement is intended to maximize the output power of a travelling wave tube, given that the level of intermodulation products should be at least 25 db below the level of the fundamental signals of the TWT output.

Unfortunately, this arrangement does not solve the problem with which applicants were faced — namely to reduce the level of IM products at a TWT output by 25 db, a far more difficult requirement and one which cannot be solved unless the effects of gain compression/expansion and capacitive/inductive AM/PM conversion are simultaneously accounted for.

SUMMARY OF THE INVENTION

Fortunately, the complementary distortion circuit disclosed and claimed herein solves the above problems, and more. More particularly, in a preferred embodiment, the invention comprises a distortion compensating circuit for a signal path subject to distortion. This circuit is characterized by means for dividing the signal path into two components of equal amplitude but differing phase and a first, non-linear phase modulator for introducing a phase-shift into one of the components, the phase shift being proportional to the instantaneous signal power in the component. The circuit further includes a second, non-linear phase modulator for introducing a phase shift into the other one of the components, the phase shift being proportional to the instantaneous signal power in the component and means, connected to the output of the first and second phase modulator, for recombining the phase-shifted components.

The invention and its mode of operation will be more fully understood from the following detailed description, when taken with the appended drawing in which:

DESCRIPTION OF DRAWINGS

FIG. 4 is a schematic diagram of an alternative form of varactor phase modulator for use in the circuit shown in FIGS. 1 and 3.

DETAILED DESCRIPTION OF THE INVENTION

Figure 1:
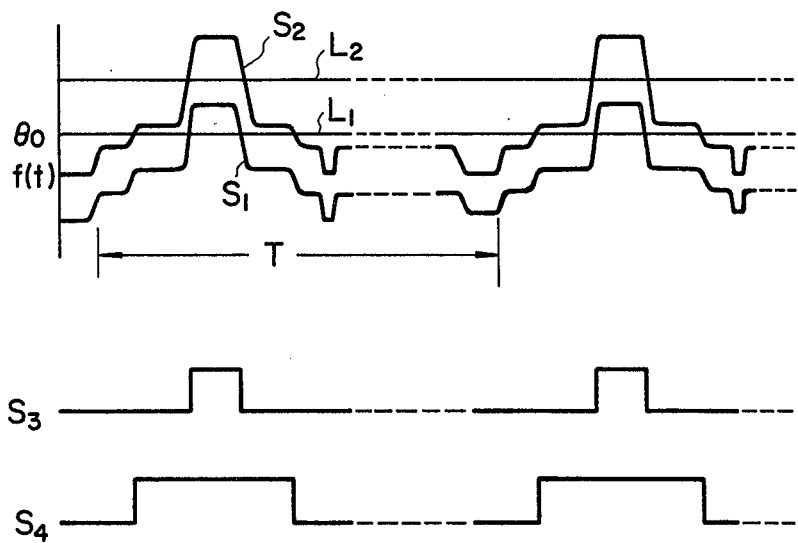
FIG. 1 is a schematic diagram of a first embodiment of the invention which employs varactor phase modulators.
Figure 2:
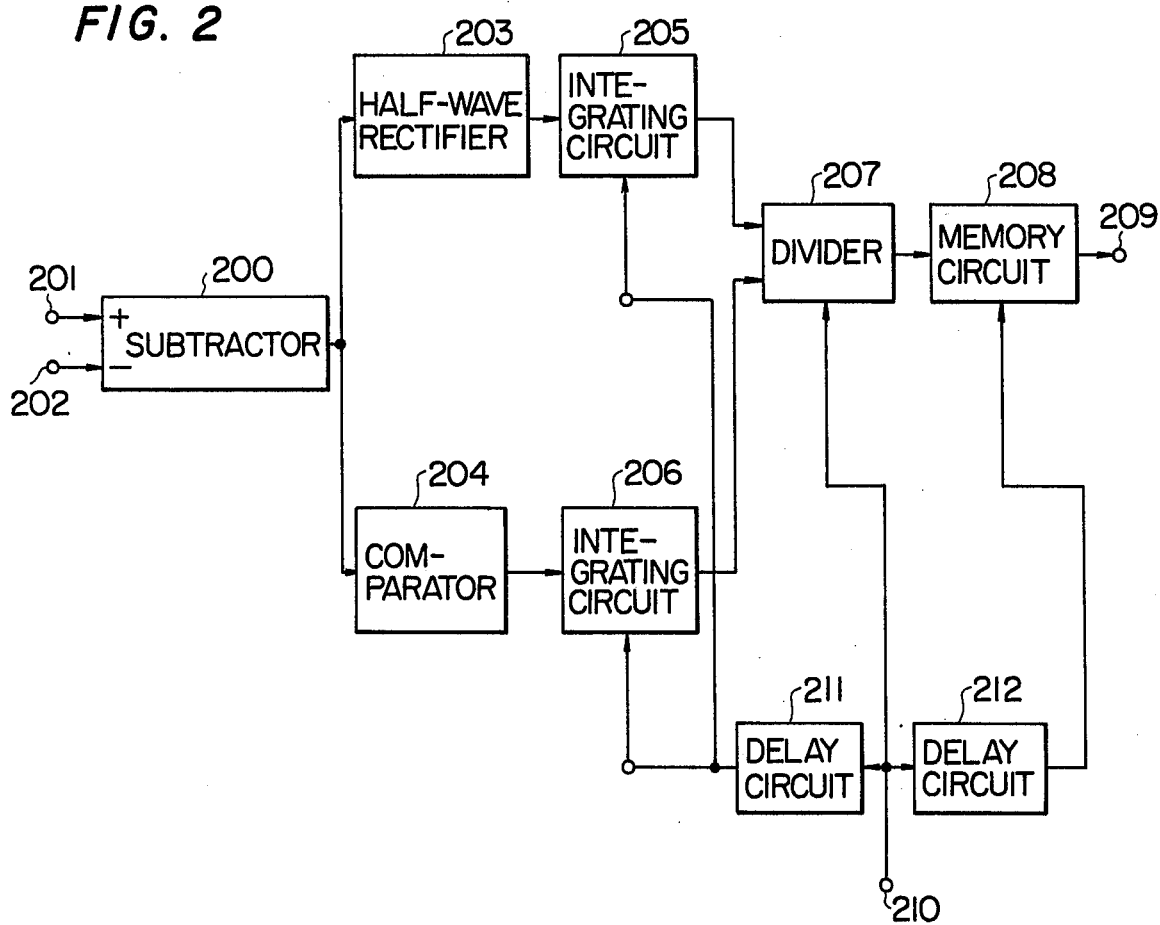
FIG. 2 is a series of vector diagrams useful in explaining the operation of the circuit shown in FIG. 1.
Figure 3:
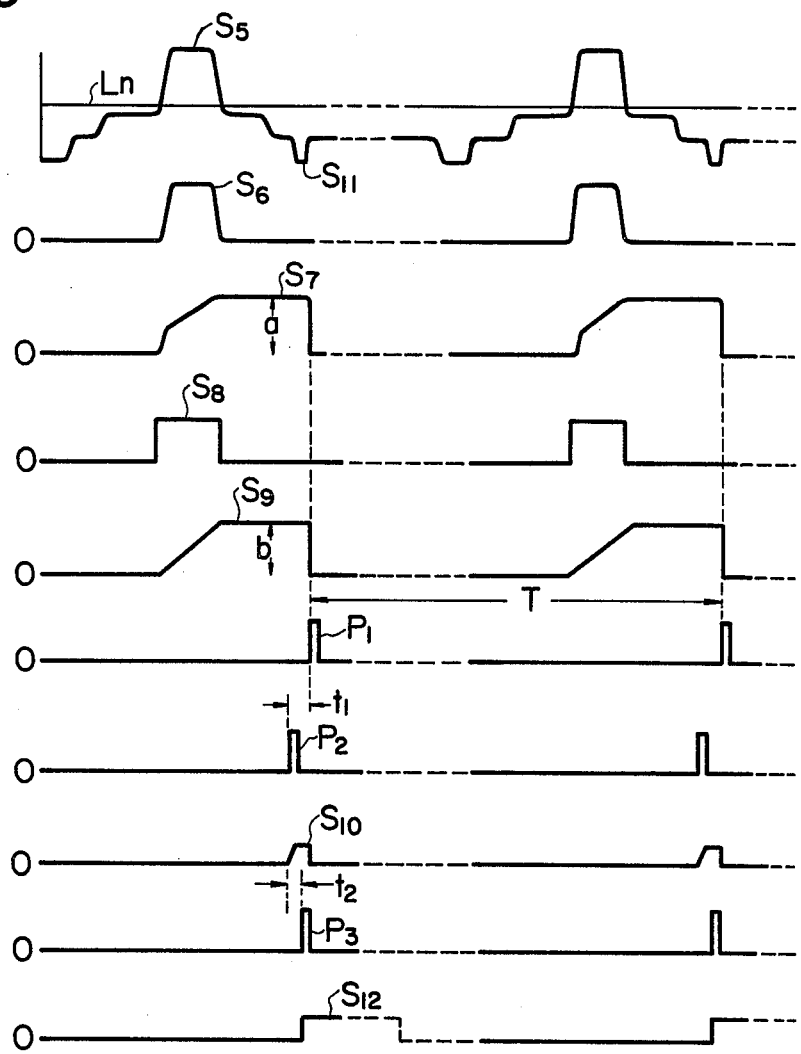
FIG. 3 is a schematic drawing of a second embodiment of the invention which employs variable biasing on the varactor phase modulators.

FIG. 1 depicts an illustrative complementary distortion circuit according to the invention. This embodiment employs varactors as the non-linear elements but, as will be discussed, other non-linear elements may also be employed. The associated vector diagrams for this circuit, are shown in FIG. 2. These diagrams assume the use of a single frequency signal. It will further be assumed that the only distortion of interest is the third-order, in-band distortion.

As shown in FIG. 1, complementary distortion circuit 10 comprises a 3 db, 90° coupler 11 and a 3db, 180 coupler 12 associated with the input and output of distortion circuit 10. A pair of phase modulators 13 and 14 are respectively connected between the ports of couplers 11 and 12. Mechanically-coupled, adjustable attenuators A1, A2 and A3, A4 are respectively connected in the input and output circuits of phase modulators 13 and 14.

Turning now to the vector diagram of FIG. 2, FIG. 2A represents the output of a typical amplifier which is driven by a single frequency input signal. In the absence of distortion, the output of this amplifier would have been represented by the vector $\overline{OP}$. The effects of an unwanted AM/PM conversion within the amplifier are represented by the vector $\overline{PR}$ and the effects of an unwanted gain compression are represented by the vector $\overline{PS}$. Together, vectors $\overline{PR}$ and $\overline{PS}$ combine to produce a distortion vector $\overline{PQ}$ and the resultant distorted amplifier output is represented by the vector $\overline{OQ}$. Obviously, the function of the complementary distortion circuit disclosed herein is to generate a distortion product which will exactly cancel vector $\overline{PQ}$. This situation is shown, for example, in FIG. 2D where the vector $\overline{CF}$ is exactly equal and opposite to vector $\overline{PQ}$ in FIG. 2A.

The desired cancelling distortion vector $\overline{CF}$ is generated in the complementary distortion circuit of FIG. 1 in the following manner. The input signal is divided into two, equal but orthogonal components by the 3 db coupler 11. Each of these components passes through a non-linear phase modulator which induces a phase-shift which is proportional to the instantaneous signal power. The non-linear phase modulation results from the fact that the reactance of the varactors employed in the modulators depends upon the signal level applied thereto. In the circuit shown in FIG. 1, reflections are minimized by using the varactors in pairs spaced apart by one-quarter wavelength. In addition, it may be advantageous to tune-out the average capacity of each varactor, by using a suitable inductive arrangement.

FIG. 2B represents the signal which passes through the upper branch of FIG. 1, that is to say the signal which passes through phase modulator 13, as it would appear at output port 4. The angle $\phi_1$ in FIG. 2B is proportional to the instantaneous signal power, i.e., to the square of the applied signal amplitude. Thus, the distortion vector $\overline{VW}$ which is produced in phase modulator 13 will be proportional to the cube of the signal amplitude. Similarly, as shown in FIG. 2C, the signal passing through the lower branch of the complementary distortion circuit, that is to say, the signal passing through phase modulator 14, is shifted in phase by an angle $\phi_2$ which is also proportional to the instantaneous signal power, which results in a distortion vector $\overline{YZ}$. The output coupler 12 combines the signals shown in FIGS. 2B and 2C into the signal shown by FIG. 2D. In FIG. 2D, vector $\overline{AB}$ represents the input to phase modulator 13 and corresponds to the vector $\overline{UV}$ in FIG. 2B. Similarly, vector $\overline{BC}$ represents the input to phase modulator 14 and corresponds to vector $\overline{XY}$ in FIG. 2C. Vector $\overline{CE}$ is the distortion generated in phase modulator 13 and corresponds to vector $\overline{VW}$ in FIG. 2B, and vector $\overline{EF}$ represents the distortion generated in phase modulator 14 and corresponds to vector $\overline{YZ}$ in FIG. 2C. It will be seen that by the appropriate adjustment of the circuit parameters the total distortion vector $\overline{CF}$ can be made equal and opposite to the distortion vector PQ which is produced within the amplifier to be equalized. Thus, the distortion vector $\overline{PQ}$ will be cancelled by vector $\overline{CF}$.

Note that although both non-linear phase modulators receive equal input signals they do not generate the same level of distortion, that is to say, $\overline{EF} \ne \overline{CE}$. While both $\overline{EF}$ and $\overline{CE}$ are proportional to the cube of the signal amplitude, the respective proportionality constants are different. If the phase modulators were to generate the same level of distortion, the combined distortion vector would represent only phase modulation and the complementary distortion circuit would not have the capacity to cancel the effects of gain compression or expansion.

It is not essential to have precisely a 90 degree phase shift between the inputs to the phase modulators. Other phase differences may be employed so long as the inputs to both phase modulators have orthogonal components. However, as discussed above, a different degree of phase modulation in the two branches of the circuit is essential if the effects of gain compression or expansion are to be cancelled.

The embodiment for calculating the $\Delta f_{wn}$ of the equation (8) has been described, but the $\Delta f_{Bn}$ of the equation (9) can be calculated in the embodiment shown in FIG. 2, in the fact that the signals $S_5$ and $\theta_n$ are applied to the negative and positive terminals 202 and 201, respectively. Therefore, an embodiment for calculating the $\Delta f_{wB}$ will be omitted.

An embodiment of this invention is shown in FIG. 4, in which an image signal $f(t)$ from an industrial TV camera, for instance, is applied to a terminal 400. The signal $f(t)$ is supplied to a comparator 401 and at same time to basic circuits 402 and 403, each of which corresponds to the circuit shown in FIG. 2. In more detail, the signal $f(t)$ is supplied to the positive terminal 201 of the subtractor 200 in the basic circuit 402 and to the negative terminal 202 of the subtractor 200 in the basic circuit 403. A memory circuit 404 stores a value $\theta_n$ of a threshold level, where $n$ is 0, 1, 2, . . . . . , the output of which is supplied to the negative terminal 202 of the subtractor 200 in the basic circuit 402 and to the positive terminal 201 of the subtractor 200 in the basic circuit 403. As a result, $\Delta f_{wn}$ and the $\Delta f_{Bn}$ are output from the basic circuits 402 and 403, as have been described in FIG. 2. Memory circuits 405 and 406 store the values of $\alpha_n$ and $\beta_n$ shown by the equation (7). The various values of $\alpha_n$ and $\beta_n$ can be selectively output by control signals applied to terminals 407 and 408. The values of $\alpha_n$ and $\beta_n$ depend upon the type of signal $f(t)$ and the operating condition of the system, etc. and are selected experimentally. In this embodiment, the value of $\alpha_n$ is in the range of about 0.5 to 0.7, typically 0.55 and the value of $\beta_n$ is in the range of about 0.3 to 0.5, typically 0.45. The outputs of the basic circuit 402 and the memory circuit 405, and the outputs of the basic circuit 403 and the memory circuit 406 are supplied to multipliers 409 and 410, respectively, so that the $\alpha_n \Delta f_{wn}$ and the $\beta_n \Delta f_{Bn}$ are obtained as the outputs of the multipliers 409 and 410, respectively. The outputs of the multipliers 409 and 410 are supplied to a subtractor 411, in which $(\alpha_n \Delta f_{wn} - \beta_n \Delta f_{Bn})$ is calculated. An adder 412 is supplied the outputs of the subtractor 411 and the memory circuit 404, so that the value $\theta_{n+1}$ of the threshold level shown by the equation (7) is output. The output of the subtractor 411, on the other hand, is supplied to a discriminator 413 in order to discriminate whether $|\alpha_n \Delta f_{wn} - \beta_n \Delta f_{Bn}|$ is larger or smaller than $\epsilon$. The value of $\epsilon$ depends upon the type of the signal $f(t)$ and the operating condition of the system, etc. and is selected experimentally. In this embodiment, the value of $\epsilon$ is selected to about 1/64 while the image signal $f(t)$ is normarized by the steps of 64. Accordingly, when $|\alpha_n \Delta f_{wn} - \beta_n \Delta f_{Bn}|$ is smaller than $\epsilon$, an output pulse is produced from the discriminator 413 and supplied to an analog switching circuit 414 and a gate circuit 415, so that the value $\theta_{n+1}$ of the threshold level is supplied from the adder 412 through the analog switching circuit 414 to the comparator 401. As a result, the signal $f(t)$ is converted to the binary signal with the value $\theta_{n+1}$ of the threshold level and the binary signal is obtained from the output terminal 416. However, when $|\alpha_n \Delta f_{wn} - \beta_n \Delta f_{Bn}|$ is larger than $\epsilon$, an output signal $\theta_{n+1}$ is supplied to the memory circuit 404 through the analog switching circuit 414, the contents of which are rewritten from $\theta_n$ to $\theta_{n+1}$. As a result, the operation described above is repeated until the value of $|\alpha_n \Delta f_{wn} - \beta_n \Delta f_{Bn}|$ becomes smaller than $\epsilon$.

Figure 5:
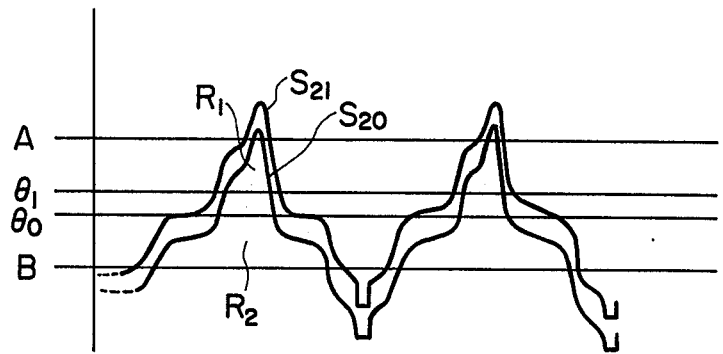
FIG. 5 is a schematic diagram of a third embodiment of the invention which employs a varistor expandor and a varistor compressor in the upper and lower circuit branches respectively.

Although the above embodiments are applied in the case where the waveform of the signal $f(t)$ is simple such as shown in FIG. 1, modified embodiments will be explained hereinafter, which are applied in the case where the waveform of the signal $f(t)$ is complicated, such as shown in FIG. 5.

Referring now to FIG. 5, the signal $f(t)$ is shown as a signal $S_{20}$ which is converted into a binary signal with a threshold level $\theta_0$. A waveform $S_{21}$ shows a signal having been varied from the signal $S_{20}$. The principle of the modified embodiment is to make a simple waveform in the region of the signal to be converted into the binary signal, whereby the suitable threshold level can always be obtained in the complicated waveform even if noise signals included therein. With respect to FIG. 5, a level A is used for neglecting the signal thereover and a level B is for neglecting the signal thereunder. In this case, as described above, the value $\theta_1$ of the next threshold level is obtained as follows.

First of all, the following integrations are calculated in the first frame picked-up by the image pick-up device.

$$\Delta f_{w0A} = \frac{\int_{t_{w0A}} (f(t) - \theta_0) \, dt}{\int_{t_{w0A}} dt} \tag{11}$$

$$\Delta f_{B0B} = \frac{\int_{t_{B0B}} (\theta_0 - f(t)) \, dt}{\int_{t_{B0B}} dt} \tag{12}$$

where $\Delta f_{w0A}$ and $\Delta f_{B0B}$ are the average levels of the regions $R_1$ and $R_2$, each of which is between the level A and the threshold level $\theta_0$, and the level B and the threshold level $\theta_0$, respectively; $t_{w0A}$ and $t_{B0B}$ are time regions defined by $A \geqq f(t) \geqq \theta_0$ and $\theta_0 \geqq f(t) \geqq B$, respectively. Accordingly, the value $\theta_1$ of the threshold level is compensated by the following equation (13).

$$\theta_1 = \theta_0 + \gamma_0 \{\delta_0 \Delta f_{w0A} - (1-\delta_0) \Delta f_{B0B}\} \tag{13}$$

where $\delta_0 (\geqq 0)$ and $(1-\delta_0)$ are constants relating to the weights of $\Delta f_{w0A}$ and $\Delta f_{B0B}$; $\gamma_0$ is a constant for adjusting the degree to be compensated, for instance, when the degree to be compensated is insufficient, the value thereof is larger than 1 and when it is over a suitable value, the value thereof is smaller than 1.

Next, the value of $|\gamma_0 \{\delta_0 \Delta f_{w0A} - (1-\delta_0) \Delta f_{B0B}\}|$ is discriminated whether it is larger or smaller than $\epsilon$. As a result, the value $\theta$ of the compensated threshold level is utilized as the threshold level for the image signal of the next frame when $|\gamma_0 \{\delta_0 \Delta f_{w0A} - (1-\delta_0) \Delta f_{B0B}\}| \geqq \epsilon$, whereas the value $\theta$ of the compensated threshold level cannot be utilized as the threshold level for the image signal of the next frame when $|\gamma_0 \{\delta_0 \Delta f_{w0A} - (1-\delta_0) \Delta f_{B0B}\}| > \epsilon$. Therefore, compensation for the threshold level is repeated as have been described. In general, when the value of $|\gamma_{n-1} \{\delta_n \Delta f_{w0A} - (1-\delta_n) \Delta f_{B0B}\}|$ is larger than the value of $\epsilon$, the value $\theta_{n+1}$ of the $(n+1)$th threshold level is compensated as follows.

$$\theta_{n+1} = \theta_n + \gamma_n \{\delta_n \Delta f_{wnA} - (1 - \delta_n) \Delta f_{BnB}\} \tag{13}$$

where $$\Delta f_{wnA} = \frac{\int_{t_{wnA}} (f(t) - \theta_n) \, dt}{\int_{t_{wnA}} dt} \tag{14}$$

$$\Delta f_{BnB} = \frac{\int_{t_{BnB}} (\theta_n - f(t)) \, dt}{\int_{t_{BnB}} dt} \tag{15}$$

$\Delta f_{wnA}$ and $\Delta f_{BnB}$ are the average levels of regions between the level A and the threshold level $\theta n$, and between the level B and the threshold level $\theta n$, respectively; $\delta n$ and $(1 - \delta n)$ are constants relating to the weight of $\Delta f_{wnA}$ and $\Delta f_{BnB}$; $\gamma_n$ is a constant for adjusting the degree to be compensated; $t_{wnA}$ and $t_{BnB}$ are time regions defined by $A \geq f(t) \geq \theta n$ and $\theta n \geq f(n) \geq B$, respectively; and $n$ is $0, 1, 2, \ldots$. In this description, the compensated threshold level is calculated from the image signal $f(t)$ over the one frame, but it can be calculated from the portion thereof. Further, the compensation of the threshold level has been solved as a linear function such as the equation (13), but a non-linear function can be used. In this case, the following equation (16) can be substituted for the equation (13)

$$\theta_{n+1} = g_2(\theta_n, \Delta f_{wnA}, \Delta f_{BnB}) \qquad (16)$$

where $g_2$ is a function of $\theta_n$, $\Delta f_{wnA}$ and $\Delta f_{BnB}$. The function $g_2$ can be defined experimentally. However, the modified embodiment of this invention will be explained relating to the compensation in accordance with the linear function.

Figure 6:
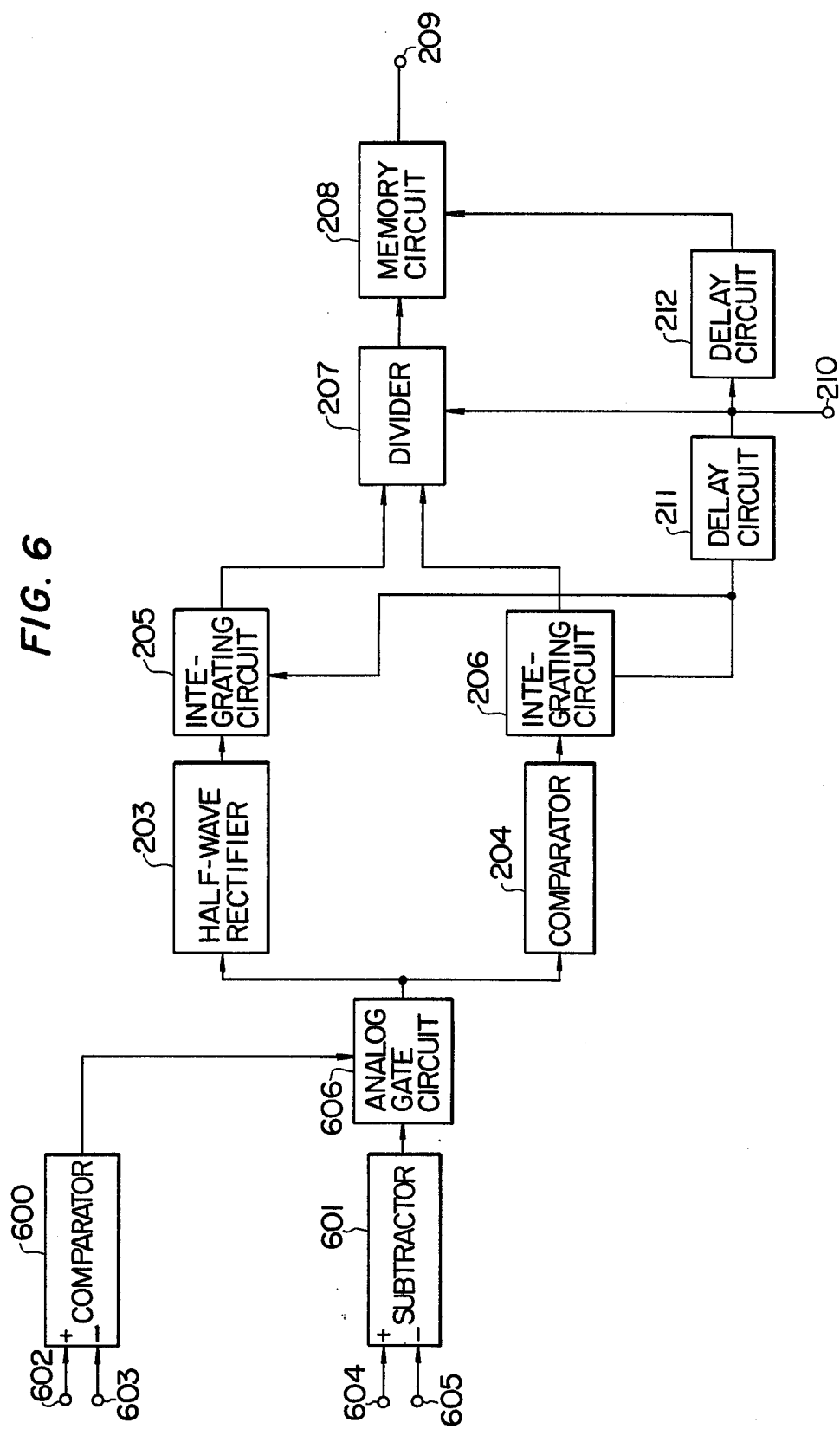
FIG. 6 is a schematic diagram of a fourth embodiment of the invention which comprises a hybrid arrangement of the embodiment shown in FIGS. 1 and 5.

Referring to FIG. 6, in which the same elements shown in FIG. 2 are designated by the same reference numerals, comparator 600 has positive and negative terminals 602 and 603, and subtractor 601 has positive and negative terminals 604 and 605. The signal $f(t)$ to be converted is applied to the positive terminals 602 and 604. The signal level A shown in FIG. 5 is applied to the negative terminal 603 and the threshold level $\theta_n$ is applied to the negative terminal 605. In the comparator 600, when the signal $f(t)$ is larger than the signal level A, the signal "1" is output from the comparator 600, whereas when the signal $f(t)$ is smaller than the signal level A, the signal "0" is output therefrom. The output of the comparator 600 is applied to an analog gate circuit 606 which is so controlled that the gate circuit 606 is closed when the signal "1" is applied thereto, whereas it is opened when the signal "0" is applied thereto. The subtractor 601 calculates the difference between the signal $f(t)$ and the threshold level $\theta_n$, the output of which is supplied to the half-wave rectifier 203 and the comparator 204 through the analog gate circuit 606 in response to the output of the comparator 600. The signal treatment after the output of the analog gate circuit 606 has been supplied to the half-wave rectifier 203 and the comparator 204 is as same as that in the case shown in FIG. 2. The detailed description relating to this signal treatment will be omitted. As a result, the output terminal 209 shown in FIG. 6 outputs the signal of the $\Delta f_{wnA}$ of the equation (14).

Although the circuit shown in FIG. 6 has been explained relating to the $\Delta f_{wnA}$, the $\Delta f_{BnB}$ of the equation (15) can be calculated thereby in the fact that the signal $f(t)$ is applied to the negative terminals 603 and 605, and the signal level B shown in FIG. 5 and the threshold level $\theta_n$ are applied to the positive terminals 602 and 604, respectively. Therefore, a description relating to a circuit for calculating the $\Delta f_{BnB}$ will be omitted.

Figure 7:
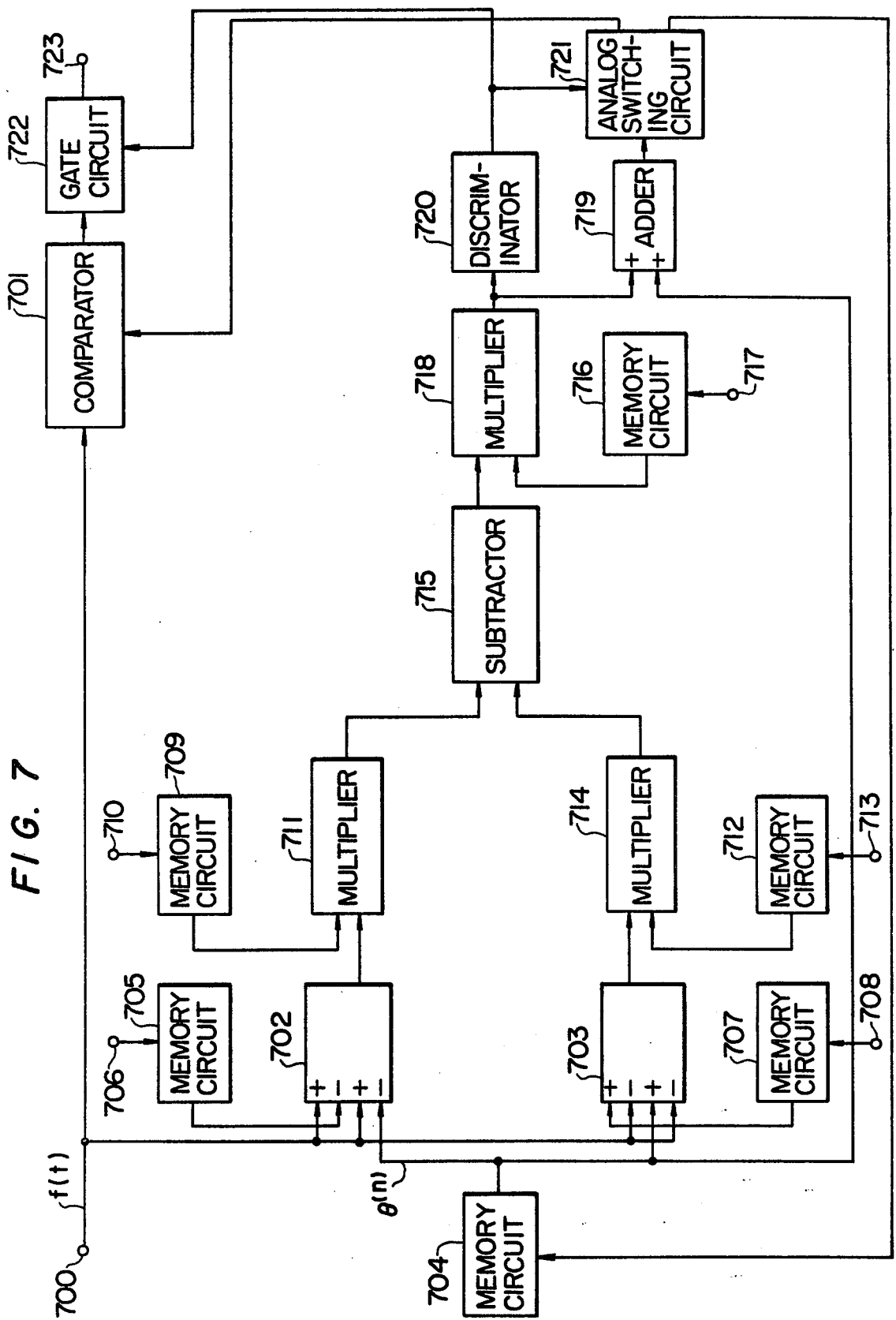

A modified embodiment of this invention is shown in FIG. 7, in which an image signal $f(t)$ from an industrial TV camera, for instance, is applied to a terminal 700. The signal $f(t)$ is supplied to a comparator 701 and basic circuits 702 and 703. The each basic circuit 702 or 703 corresponds to the circuit shown in FIG. 6. In more detail, the signal $f(t)$ is supplied to the positive terminals of the comparator 600 and the subtractor 601 in the basic circuit 702, and to the negative terminals of the comparator 600 and the subtractor 601 in the basic circuit 703. A memory circuit 704 stores a value $\theta_n$ of a threshold level, where $n$ is $0, 1, 2, \ldots$, the output of which is supplied to the negative terminal 605 of the subtractor 601 in the basic circuit 702 and to the positive terminal 604 of the subtractor 601 in the basic circuit 703. A memory circuit 705 stores the values of the level A shown in FIG. 5. The various values of the level A can be selectively output by control signals applied to a terminal 706 so that the selected value of the level A is supplied to the negative terminal 603 of the comparator 600 in the basic circuit 702. A memory circuit 707 stores the values of the level B shown in FIG. 5. The value of the level B which is selected by control signals applied to a terminal 708 is supplied to the positive terminal 604 of the comparator 600 in the basic circuit 703. In this embodiment, the values of the levels A and B are selected to be about 63 and 15, respectively, while the image signal $f(t)$ is normalized by the steps of 64. As a result, the $\Delta f_{wnA}$ and $\Delta f_{BnB}$ are output from the basic circuits 702 and 703, respectively. The outputs of the basic circuit 702 and a memory circuit 709 are supplied to a multiplier 711. The memory circuit 709 stores the various values of $\delta n$ and the value selected by control signals applied to a terminal 710 is supplied to the multiplier 711. The outputs of the basic circuit 703 and a memory circuit 712 are supplied to a multiplier 714. The memory circuit 712 stores the values of $(1 - \delta n)$ and the value selected by control signals applied to a terminal 713 is supplied to the multiplier 714. The value of $\delta n$ depends upon the type of the signal $f(t)$ and the operating condition of the system, etc. and is selected experimentally. In this embodiment, the value of $\delta n$ is in the range of about 0.5 to 0.7, typically, 0.55. The outputs of the multipliers 711 and 714 are supplied to a subtractor 715 so that the $\{\delta_n \Delta f_{wnA} - (1 - \delta n) \Delta f_{BnB}\}$ is obtained as the output thereof. A memory circuit 716 stores the various values of $\gamma_n$ and the value selected by control signals applied to a terminal 717 is supplied to a multiplier 718. The value of $\gamma_n$ depends on the type of the signal $f(t)$ and the operating condition of the system, etc. and is selected experimentally. In this embodiment, the value of $\gamma_n$ is about 1.7. The outputs of the subtractor 715 and the memory circuit 716 are calculated in the multiplier 718, so that the output $\gamma_n\{\delta_n \Delta f_{wnA} - (1 - \delta n) \Delta f_{BnB}\}$ is obtained from the multiplier 718. An adder 719 is supplied the outputs of the multiplier 718 and the memory circuit 704 so that the value $\theta_{n+1}$ of the threshold level shown by the equation (13) is obtained. The output of the multiplier 718, on the other hand, is supplied to a discriminator 720 in order to discriminate whether $|\gamma_n\{\delta_n \Delta f_{wnA} - (1 - \delta_n) \Delta f_{BnB}\}|$ is larger or smaller than $\epsilon$ which has been described above. Accordingly, an output pulse is produced from the discriminator 720 and supplied to an analog switching circuit 721 and a gate circuit 722 when $|\gamma_n\{\delta_n \Delta f_{wnA} - (1 - \delta n) \Delta f_{BnB}\}|$ is smaller than $\epsilon$. As a result, the value $\theta_{n+1}$ of the threshold level is supplied from the adder 719 through the analog switching circuit 721 to the comparator, so that the signal $f(t)$ is converted to the binary signal with the value $\theta_{n+1}$ of the threshold level and the binary signal is obtained from an output terminal 723. However, when $|\gamma_n\{\delta_n \Delta f_{wA} - (1 - \delta_n) \Delta f_{BnB}\}|$ is larger than $\epsilon$, the output signal $\theta_{n+1}$ is supplied to the memory circuit 704 through the analog switching circuit 721, the contents of which are rewritten from $\theta_n$ to $\theta_{n+1}$. Accordingly, the above operation is repeated until the value of $|\gamma_n\{\delta_n \Delta f_{wnA} - (1 - \delta_n) \Delta f_{BnB}\}|$ becomes smaller than $\epsilon$.

In the above embodiments, the average levels of the upper and the lower portions which have levels higher and lower than the threshold level $\theta_n$ are calculated by using the functions $(f(t) - \theta_n)$ and $(\theta_n - f(t))$ as shown in the equations (8), (9), (14) and (15), but functions $G_1(f(t) - \theta_n)$ and $G_2(\theta_n - f(t))$ can be substituted for them, where $G_1$ and $G_2$ are functions of $(f(t) - \theta_n)$ and $(\theta_n - f(t))$. Further, functions $H_1(\theta_n, f(t))$ and $H_2(\theta_n, f(t))$ can be substituted for $G_1(f(t) - \theta_n)$ and $G_2(\theta_n - f(t))$, respectively, where $H_1$ and $H_2$ are functions of $\theta_n$ and $f(t)$. For instance, $G_1(f(t) - \theta_n)$ is $(f(t) - \theta_n)^2$. In this case, the basic circuits as shown in FIGS. 2 and 6 are so designed that the equations relating to the functions $G_1(f)(t) - \theta_n)$ and $G_2(\theta_n - f(t))$, or $H_1(\theta_n, f(t))$ and $H_2(\theta_n, f(t))$ can be calculated. Further, the embodiments shown in FIGS. 4 and 7 are so constructed that the operations thereof are repeated, but the repeated operations may not be necessary if the values of $\alpha n, \beta n, \gamma n$ and $\delta n$ are suitable.

While only a few forms of the present invention have been shown and described, many modifications will be apparent to those skilled in the art within the spirit and scope of the invention as set forth in the appended claims.

We claim:

1. A variable thresholding circuit comprising:
   first means, to which an analog signal is applied;
   second means coupled with said first means, for converting said analog signal into binary signals with a variable threshold level; and
   third means coupled with said first and second means, for controlling said threshold level of said second means, said third means comprising
   fourth means for storing a predetermined threshold level;
   fifth means coupled with said first and fourth means, for calculating a value related to a required threshold level from average levels of the upper and lower portions of said analog signal which have levels higher and lower than said predetermined threshold level, respectively;
   sixth means coupled with said fifth means, by which the output of said fifth means is compared with a predetermined value; and
   seventh means coupled with said second, fourth, fifth and sixth means, for calculating said threshold level of said second means from the outputs of said fourth and fifth means, the output of said seventh means supplied to said second means in response to the output of said sixth means in such a manner that the threshold level of said second means is controlled.

2. A variable thresholding circuit according to claim 1, wherein said fifth means includes eighth means coupled with said first and fourth means, for calculating said average level of the upper portion of said analog signal which has a level higher than said predetermined threshold level, with a predetermined weight, and ninth means, coupled with said first and fourth means, for calculating said average level of the lower portion of said analog signal which has a level lower than said predetermined threshold level with a predetermined weight.

3. A variable thresholding circuit according to claim 2, wherein said seventh means is further coupled with said fourth means in such a manner that the contents of said fourth means are rewritten by the output of said seventh means when the output of said fifth means is larger than said predetermined value.

4. A variable thresholding circuit comprising:
   first means, to which an analog signal is applied;
   second means coupled with said first means, for converting said analog signal into binary signals with a variable threshold level; and
   third means coupled with said first and second means, for controlling said threshold level of said second means, said third means comprising
   fourth means for storing a predetermined threshold level;
   fifth means coupled with said first and fourth means for calculating a value related to a required threshold level from average levels of the divided regions of said analog signal, said divided regions of said analog signal placed between a first predetermined level and said predetermined threshold level and between a second predetermined level and said predetermined threshold level, said respective regions being the upper and lower portions of said analog signal, respectively, with respect to said predetermined threshold level;
   sixth means coupled with said fifth means, by which the output of said fifth means is compared with a predetermined value; and
   seventh means coupled with said second, fourth, fifth and sixth means, for calculating said threshold level of said second means from the outputs of said fourth and fifth means, the output of said seventh means supplied to said second means in response to the output of said sixth means in such a manner that the threshold level of said second means is controlled.

5. A variable thresholding circuit according to claim 4, wherein said fifth means includes eighth means coupled with said first and fourth means for calculating said average level of said upper region, with a predetermined weight, and ninth means coupled with said first and fourth means, for calculating said average level of the lower region, with a predetermined weight.

6. A variable thresholding circuit according to claim 5, wherein further includes tenth means coupled with said fifth means, for adjusting the output of said fifth means, with a predetermined weight, the output of said tenth means applied to said sixth and seventh means.

7. A variable thresholding circuit according to claim 6, wherein said seventh means is further coupled with said fourth means in such a manner that the contents of said fourth means are rewritten by the output of said seventh means when the output of said fifth means is larger than said predetermined value.

8. A variable thresholding circuit comprising:
   first means, to which an analog signal is applied;
   second means coupled with said first means, for converting said analog signal into a binary signal with a variable threshold level; and
   third means coupled with said first and second means, for changing said threshold level of said second means, said third means including
   fourth means for storing a first threshold level;
   fifth means, coupled with said first and fourth means, for calculating the difference between values corresponding to average levels of the upper and lower portions of said analog signal which have levels higher and lower than said first threshold level, respectively;

sixth means coupled with said fifth means, for comparing the calculation result of said fifth means with a predetermined value; and seventh means coupled with said second, fourth, fifth and sixth means, for obtaining a second threshold level by adding the calculation result of said fifth means to said first threshold level of said fourth means, said second threshold level being supplied to said second means as said threshold level in response to the comparison result of said sixth means indicating that the calculation result of said fifth means is smaller than said predetermined value.

9. A variable thresholding circuit according to claim 8, which further includes eighth means coupled with said fourth, sixth and seventh means for supplying said second threshold level to said fourth means so that the contents of said fourth means are rewritten by said second threshold level, in response to the comparison result of said sixth means indicating that the calculation result of said fifth means is larger than said predetermined value.

10. A variable thresholding circuit according to claim 8, wherein said fifth means includes ninth means, coupled with said first and fourth means, for calculating said average level of the upper portion of said analog signal, with a predetermined weight, tenth means coupled with said first and fourth means, for calculating said average level of the lower portion of said analog signal, with a predetermined weight, and eleventh means, coupled with said ninth and tenth means, for calculating the difference between calculation results of said ninth and tenth means.

11. A variable thresholding circuit according to claim 8, wherein said fifth means includes ninth means, coupled with said first and fourth means, for calculating a value corresponding to said average level of the upper portion of said analog signal which has a level lower than a first predetermined level, tenth means, coupled with said first and fourth means, for calculating a value corresponding to said average level of the lower portion of said analog signal, which has a level higher than a second predetermined level, and eleventh means, coupled with said ninth and tenth means, for caclulating a value corresponding to the difference between the calculation results of said ninth and tenth means.

12. A variable thresholding circuit according to claim 11, which further includes twelfth means, coupled with said fourth, sixth and seventh means, for supplying said second threshold level to said fourth means, so that the contents of said fourth means are rewritten by said second threshold level, in response to the comparison result of said sixth means indicating that the calculation result of said fifth means is larger than said predetermined value.

* * * * *